(12) United States Patent
Kim et al.

(10) Patent No.: US 10,804,486 B2
(45) Date of Patent: Oct. 13, 2020

(54) DISPLAY DEVICE

(71) Applicant: LG Display Co., Ltd., Seoul (KR)

(72) Inventors: Jaeyul Kim, Gyeongsangbuk-do (KR);
Seunghoon Yang, Daegu (KR);
HyeonSoo Hong, Daegu (KR);
Byounghee Ku, Daegu (KR)

(73) Assignee: LG Display Co., Ltd., Seoul (KR)

( * ) Notice: Subject to any disclaimer, the term of this patent is extended or adjusted under 35 U.S.C. 154(b) by 528 days.

(21) Appl. No.: 15/489,980

(22) Filed: Apr. 18, 2017

(65) Prior Publication Data
US 2018/0184529 A1    Jun. 28, 2018

(30) Foreign Application Priority Data

Dec. 23, 2016    (KR) .................... 10-2016-0178201

(51) Int. Cl.
*H05K 5/00*    (2006.01)
*H01L 51/52*    (2006.01)
(Continued)

(52) U.S. Cl.
CPC ............ *H01L 51/5237* (2013.01); *B32B 3/02* (2013.01); *B32B 7/12* (2013.01); *H01L 51/0097* (2013.01);
(Continued)

(58) Field of Classification Search
CPC ............. H01L 51/5237; H01L 51/0097; H01L 51/5246; H01L 2251/5338; B32B 7/12; B32B 3/02; B32B 2457/20; B32B 2457/202; B32B 2457/206; B32B 2307/416; B32B 7/06; B32B 3/28; B32B 3/30; B32B 2307/71; B32B 2307/402; B32B 2307/412; B32B 2307/7246; B32B 2307/732; B32B 2307/748; B32B 2307/538; B32B 2307/546; B32B 17/06; B32B 27/281; B32B 27/06; B32B 27/36;
(Continued)

(56) References Cited

U.S. PATENT DOCUMENTS

2013/0082961 A1* 4/2013 Wang ...................... G06F 3/044
    345/173
2014/0071537 A1* 3/2014 Park ........................ G02B 7/00
    359/614

(Continued)

FOREIGN PATENT DOCUMENTS

KR       10-0622894 B1    9/2006
KR    10-2011-0069462 A   6/2011
(Continued)

*Primary Examiner* — Eli D. Strah
(74) *Attorney, Agent, or Firm* — Morgan, Lewis & Bockius LLP

(57) ABSTRACT

A display device is provided. The display device includes a cover window having a display area and a non-display area surrounding the display area, an adhesive layer in direct contact with a lower part of the cover window, a print layer disposed under the adhesive layer and including a plurality of layers, and a delamination reduction layer disposed under the print layer. In the delamination reduction layer, an opposite surface of one surface in contact with the print layer has a higher surface energy than a lowermost layer among the plurality of layers of the print layer.

9 Claims, 10 Drawing Sheets

(51) Int. Cl.
*B32B 7/12* (2006.01)
*B32B 3/02* (2006.01)
*H01L 51/00* (2006.01)
*G02F 1/1333* (2006.01)

(52) U.S. Cl.
CPC .... *H01L 51/5246* (2013.01); *B32B 2307/416* (2013.01); *B32B 2457/20* (2013.01); *B32B 2457/202* (2013.01); *B32B 2457/206* (2013.01); *C09J 2203/306* (2013.01); *G02F 1/133308* (2013.01); *G02F 2001/133331* (2013.01); *G02F 2202/28* (2013.01); *H01L 2251/5338* (2013.01); *Y02E 10/549* (2013.01)

(58) Field of Classification Search
CPC ..... B32B 27/08; B32B 15/08; B32B 2250/44; B32B 2255/20; B32B 2255/26; B32B 2255/28; G02F 1/133308; G02F 2001/133331; G02F 2202/28; C09J 2203/306; Y02E 10/549
See application file for complete search history.

(56) References Cited

U.S. PATENT DOCUMENTS

2016/0372701 A1* 12/2016 Kwon ................. G02B 1/14
2017/0068128 A1* 3/2017 Lim .................. G02F 1/133512

FOREIGN PATENT DOCUMENTS

| KR | 10-2012-0139407 A | 12/2012 |
|----|-------------------|---------|
| KR | 10-1522622 B1 | 6/2015 |
| WO | WO-2015031246 A1 * | 3/2015 |

\* cited by examiner

DISPLAY DEVICE

CROSS-REFERENCE TO RELATED APPLICATIONS

This application claims the priority of Korean Patent Application No. 10-2016-0178201 filed on Dec. 23, 2016, in the Korean Intellectual Property Office, the disclosure of which is incorporated herein by reference.

BACKGROUND

Field

The present disclosure relates to a display device, and more particularly, to a display device in which the adhesive power of a print layer is improved and the generation of bubbles that may be caused by a change in shape of the print layer is reduced.

Description of the Related Art

Flat panel display devices such as liquid crystal display devices, organic light emitting diode display devices, etc. have a small thickness and low power consumption and thus have received a lot of attention as next-generation display devices.

In such a display device, a front surface includes a display area and a non-display area. The display area is an area on which an image from a display panel disposed therein is displayed, and the non-display area is an area on which the image is not displayed. In this case, the non-display area of the display device includes a decoration film for shielding a light emitted from the display panel.

SUMMARY

A related art decoration film includes a PET layer containing polyethylene terephthalate in order to secure stiffness of the decoration film. However, in order to meet the demands for thinner display devices, a decoration film from which the PET layer is removed has been researched.

However, because the PET layer is removed from the decoration film, when one of release papers respectively covering upper and lower parts of the decoration film is removed, the release paper is not removed from the decoration film. Instead, a part of the decoration film is removed together with the release paper to be removed, which results in a delamination failure.

Accordingly, the inventors of the present disclosure recognized that since an area corresponding to a display area of the decoration film is removed, the decoration film is removed together with the release paper while removing the release paper from the decoration film, so that a defect rate is increased during a manufacturing process. Therefore, the inventors manufactured an adhesive layer capable of increasing the adhesive power between a decoration film and a release paper disposed on one side of the decoration film. Then, the inventors invented a display device in which when the release paper is removed, the removal of the decoration film can be suppressed.

Accordingly, embodiments of the present disclosure are directed to a display device that substantially obviates one or more of the problems due to limitations and disadvantages of the related art.

An aspect of the present disclosure is to provide a display device with improved adhesive performance between a decoration film from which a PET layer is removed and of which an area corresponding to a display area is opened and a release paper disposed on one side thereof.

Another aspect of the present disclosure is to provide a display device in which the generation of bubbles that may occur when a decoration film and a display panel are bonded to each other can be prevented.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

According to an aspect of the present disclosure, a display device comprises a cover window including a display area and a non-display area surrounding the display area, an adhesive layer in direct contact with a lower part of the cover window, a print layer disposed under the adhesive layer and including a plurality of layers, and a delamination reduction layer disposed under the print layer. In the delamination reduction layer, an opposite surface of one surface in contact with the print layer has a higher surface energy than a lowermost layer among the plurality of layers of the print layer. The display device according to an aspect of the present disclosure includes the delamination reduction layer with a high surface energy. Thus, when a protective film mounted on one surface of a decoration film is removed, the decoration film is not removed together with it. Therefore, it is possible to minimize a delamination failure of the decoration film.

In another aspect, a display device comprises a cover window including a display area, a decoration film disposed on a back surface of the cover window and including a display area opening configured to make it possible to be seen from the outside, and a display panel disposed under the decoration film. The decoration film includes an adhesive layer bonded to the back surface of the cover window, a print layer disposed under a mold layer and including a plurality of layers, and a delamination reduction layer disposed under the print layer. In the delamination reduction layer, an opposite surface of one surface in contact with the print layer has a higher surface energy than a lowermost layer among the plurality of layers of the print layer. The display device according to another aspect of the present disclosure includes the decoration film including the opening corresponding to the display area. Thus, it is possible to provide clear images.

Details of other exemplary embodiments will be included in the detailed description of the invention and the accompanying drawings.

According to the present disclosure, a delamination reduction layer with a high surface energy is provided. Thus, when a protective film is removed from a decoration film, the decoration film is not removed together with the protective film. Therefore, it is possible to solve a reverse delamination problem during a manufacturing process.

Further, according to the present disclosure, the delamination reduction layer is formed in the same process as a print layer. Thus, an additional process is not required. Therefore, it is possible to provide a display device with higher economic efficiency during a manufacturing process.

Furthermore, according to the present disclosure, the print layer having a step shape is provided. Thus, a space between a decoration film adhesive layer and a cover window and the decoration film can be minimized. Therefore, it is possible to minimize bubbles which may be generated between the cover window and the decoration film adhesive layer.

Also, according to the present disclosure, the decoration film without a PET layer is provided. Therefore, it is possible to provide a decoration film with a small thickness and also possible to provide a display device with reduced manufacturing costs.

Moreover, according to the present disclosure, the decoration film without a PET layer is provided. Therefore, it is possible to provide a decoration film with a small thickness and thus possible to implement a display device which can be easily bent.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
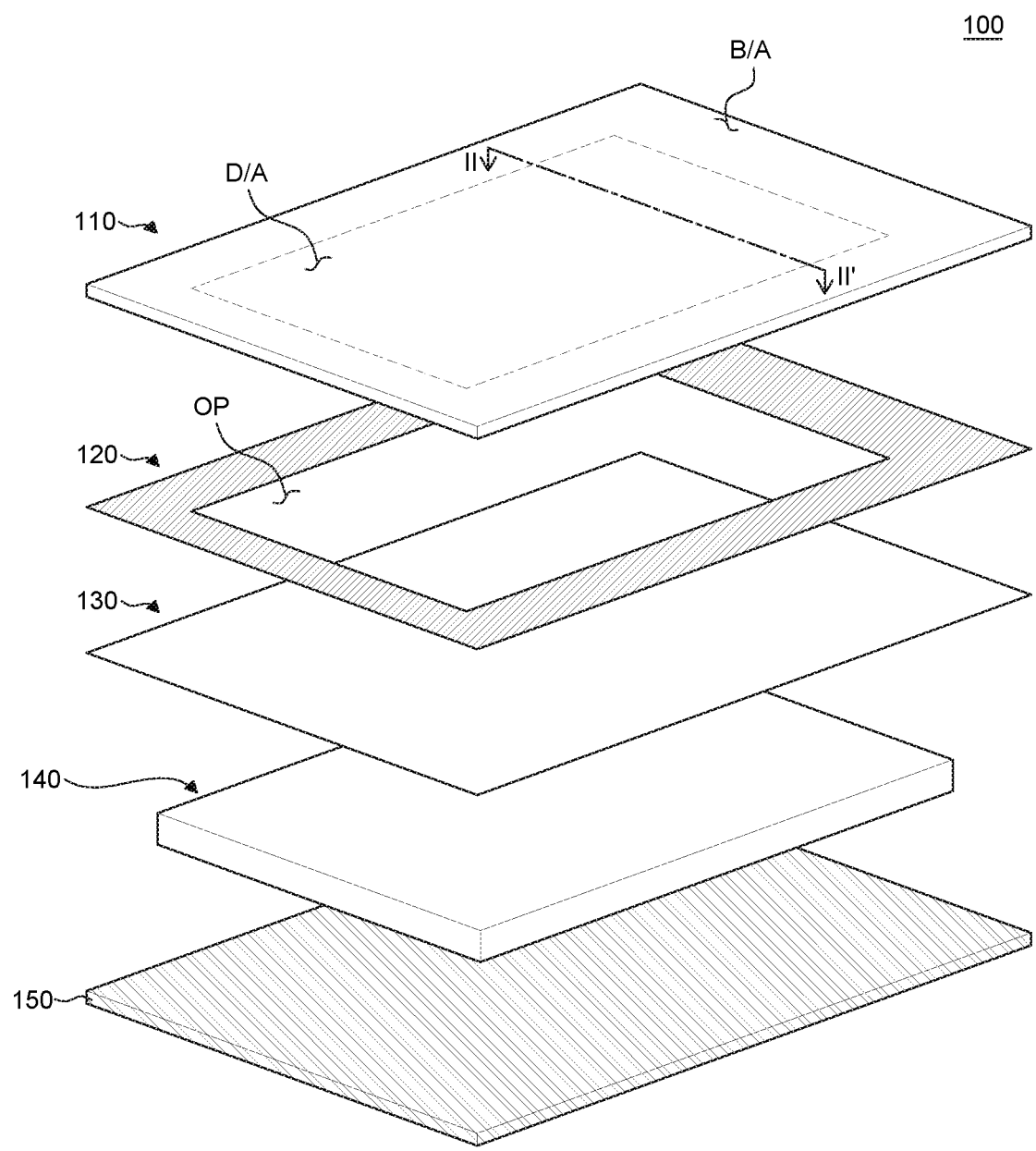
FIG. 1 is a schematic exploded perspective view of a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
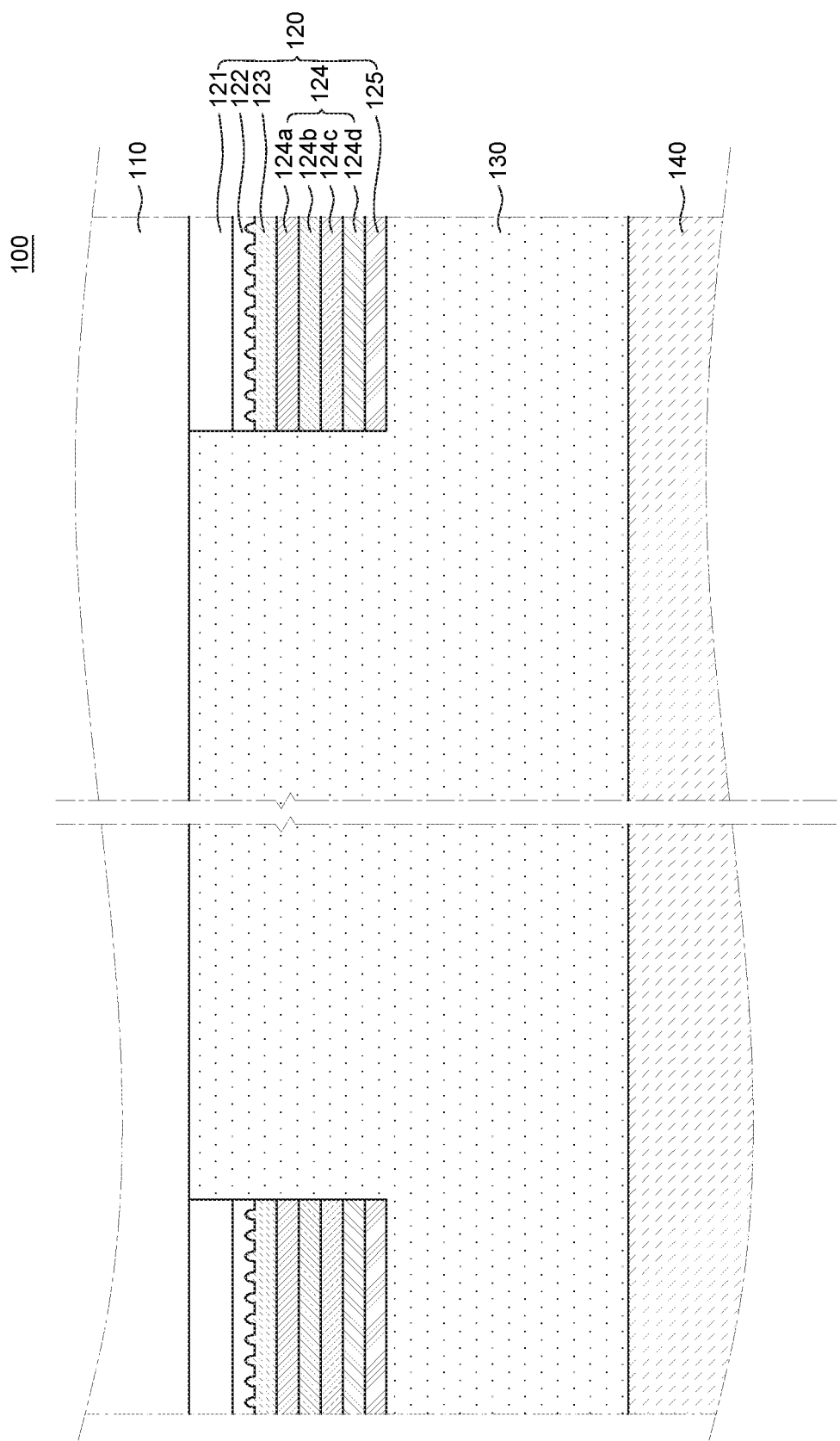
FIG. 2 is a schematic cross-sectional view taken along a line II-II' of FIG. 1.

FIG. 1 is a schematic exploded perspective view of a display device according to an exemplary embodiment of the present disclosure. FIG. 2 is a schematic cross-sectional view taken along a line II-II' of FIG. 1.

A display device according to an exemplary embodiment of the present disclosure may be implemented with various display devices. For example, the display device may be implanted with a liquid crystal display device, an organic light emitting display device, an electrophoretic display device, an electro-wetting display device, a quantum dot display device, etc. Hereinafter, the display device will be described as, but not limited to, an organic light emitting display device for convenience in explanation.

Referring to FIG. 1 and FIG. 2, a display device 100 includes a cover window 110, a decoration film 120, a decoration film adhesive layer 130, a display panel 140, and a back cover 150. The cover window 110 covers the display panel 140 and protects the components of the display panel 140 against external shocks, foreign materials, or moisture.

Specifically, as illustrated in FIG. 1 and FIG. 2, the cover window 110 may be formed into a shape corresponding to the decoration film 120 and the display panel 140. Further, the cover window 110 may include a display area D/A and a bezel area B/A surrounding the display area D/A. The cover window 110 may also be formed to include a curved shape corresponding to various shapes of the display device 100. For example, at least one edge of the cover window 110 may be formed to be curved toward the back cover 150.

The cover window 110 may be formed of glass having excellent stiffness or plastic which is thermoformable and has high processability. For example, the cover window 110 may be formed of tempered glass or polyethylene terephthalate. The cover window 110 may protect the components within the display device 100 against shocks applied to the display device 100 from the outside.

The cover window 110 includes the display area D/A on which an image implemented through the display panel 140 is displayed and the bezel area B/A surrounding the display area D/A. Herein, the bezel area B/A may also be referred to as a non-display area. The bezel area B/A of the cover window 110 has a very small width, and almost the whole area of the cover window 110 is configured as the display area D/A. In this case, the display device 100 according to an exemplary embodiment of the present disclosure is implemented as the display device 100 including a narrow bezel having a small width.

In various exemplary embodiments, the cover window 110 may be configured to function as a touch screen. Specifically, at least one ITO film in which an ITO (indium tin oxide) electrode is disposed may be disposed on a back surface of the cover window 110. Further, the cover window 110 may be configured as a touch screen which can generate an electric signal in response to an operation such as a contact between ITO electrodes of two or more ITO films spaced from each other caused by a pressure applied to the surface.

As illustrated in FIG. 1 and FIG. 2, the decoration film 120 may be disposed in the bezel area B/A of the cover window 110. The decoration film 120 is configured to block a light incident into the bezel area B/A in order to suppress the generation of unnecessary light leakage from the bezel area B/A. Further, the decoration film 120 may include various layers to provide various textures or colors which can be seen from the outside.

The decoration film 120 may be formed in a size corresponding to the cover window 110, and includes a display area opening OP having a size corresponding to the display area D/A of the cover window 110. The display area opening OP (refer to FIG. 4) is formed in order for an image displayed through the display panel 140 to be seen from the outside. Further, the opening of the decoration film 120 may include an opening for various sensors including an infrared (IR) sensor of the display device 100 and a camera which may be disposed on a front surface of the display device 100.

The decoration film 120 of the cover window 110 may be formed in various colors to make harmony with the color of an electronic device including the display device 100. For example, if the display device 100 is applied to a bright white smart phone, at least some layers of the decoration film 120 of the cover window 110 may be white. In this case, the light shielding property of the decoration film 120 of the cover window 110 may be decreased.

Referring to FIG. 2, the decoration film 120 includes an adhesive layer 121, a pattern layer 122, a mold layer 123, a print layer 124, and a delamination reduction layer 125. Herein, the adhesive layer 121, the print layer 124, and the delamination reduction layer 125 of the decoration film 120 may be disposed in the non-display area. That is, the decoration film 120 may be formed in the area of the cover window 110 except the display area D/A and the display area opening OP corresponding to the display panel 140. Specifically, the decoration film 120 may be disposed in the area corresponding to the bezel area B/A of the cover window 110.

The adhesive layer 121 may be in direct contact with a lower part of the cover window 110. The adhesive layer 121 is a layer of which both surfaces have an adhesion function, and may be formed using, e.g., an OCA (optically clear adhesive) film or OCR (optically clear resin). The adhesive layer 121 may have a thickness of, e.g., 10 µm. The adhesive layer 121 functions to bond the cover window 110 to the other components of the decoration film 120.

The pattern layer 122 is disposed under the adhesive layer 121, and may have a pattern. The pattern layer 122 may be formed of an ultraviolet-curable resin. The pattern layer 122 may have a thickness of, e.g., 5 µm to 10 µm. In the pattern layer 122, various patterns which can be seen from the outside and thus provide various textures may be formed.

The mold layer 123 is disposed under the pattern layer 122, and may be deposited to cover a lower surface of the pattern layer 122. The mold layer 123 may be formed of a material, e.g., silicon dioxide ($SiO_2$), capable of easily reflecting light. The mold layer 123 may have a thickness of, e.g., 5 µm to 10 µm.

Specifically, the pattern layer 122 has a pattern which can provide various textures. However, the pattern layer 122 is formed of the ultraviolet-curable resin that is transparent and thus cannot reflect light. Thus, the mold layer 123 containing a material which can reflect light is disposed under the pattern layer 122. Therefore, it is possible to easily reflect light according to a pattern shape of the pattern layer 122.

Further, the mold layer 123 may be disposed to cover the lower surface of the pattern layer 122 and fill a lower part of the pattern. Thus, the mold layer 122 can maintain the pattern shape of the pattern layer 122. Furthermore, the mold layer 123 may fill the curves of the pattern of the pattern layer 122 and flatly maintain a surface in contact with the print layer 124 disposed under the pattern layer 122. Thus, the print layer 124 can be securely bonded.

The print layer 124 is disposed under the mold layer 123, and includes a plurality of layers configured to be seen from the outside. Specifically, as illustrated in FIG. 2, the print layer 124 may include a first layer 124a, a second layer 124b, a third layer 124c, and a fourth layer 124d. Each of the first layer 124a, the second layer 124b, the third layer 124c, and the fourth layer 124d may have a thickness of, e.g., about 6 µm but is not limited thereto.

The plurality of layers of the print layer 124 may be seen from the outside by reflecting visible light incident from the outside. Therefore, various characters, shapes, and colors printed on the print layer 124 can be seen from the outside. Meanwhile, unlike the illustration in FIG. 2, the plurality of layers may not be limited to the four layers, but may include one or more layers various in number.

The delamination reduction layer 125 is disposed under the print layer 124. Specifically, the delamination reduction layer 125 may be disposed under the fourth layer 124d of the print layer 124. As illustrated in FIG. 2, the delamination reduction layer 125 may have the same width as the fourth layer 124d of the print layer 124, but is not limited thereto. The delamination reduction layer 125 may have a smaller width than the fourth layer 124d of the print layer 124. The delamination reduction layer 125 may have a thickness of, e.g., about 6 µm, but is not limited thereto.

In the delamination reduction layer 125, an opposite surface of one surface in contact with the print layer 124 has a higher surface energy than the fourth layer 124d which is the lowermost layer among the plurality of layers of the print layer 124. The surface energy of the delamination reduction layer 125 expressed in value of surface tension may be, for example, 30 dyne/cm or more and preferably 36 dyne/cm or more. Therefore, the adhesive power of the delamination reduction layer 125 may be greater than that of the fourth layer 124d. Details thereof will be described below with reference to FIG. 4.

The decoration film adhesive layer 130 is formed in a size corresponding to the cover window 110. The decoration film adhesive layer 130 functions to bond the cover window 110 and the display panel 140 to each other and bond the decoration film 120 and the display panel 140 to each other. The decoration film adhesive layer 130 may be formed using, e.g., an OCA (optically clear adhesive) film or OCR (optically clear resin). The decoration film adhesive layer 130 is also disposed on a lower surface of the display area D/A of the cover window 110. Therefore, preferably, the decoration film adhesive layer 130 may be formed to have a high light transmittance.

The decoration film adhesive layer 130 may be formed thicker than the decoration film 120. For example, the decoration film adhesive layer 130 may have a thickness of from about 150 μm to about 200 μm. Further, the decoration film adhesive layer 130 may be capable of being easily stretched when being pressured or heated. The decoration film adhesive layer 130 is disposed along the cover window 110 in the display area D/A, the adhesive layer 121, the print layer 124, and the delamination reduction layer 125. The decoration film adhesive layer 130, the cover window 110, the decoration film 120, and the display panel 140 are bonded by the following method. Firstly, the decoration film 120 is bonded to one surface of the cover window 110. Then, the cover window 110 to which the decoration film 120 is bonded is bonded to the display panel 140 to which the decoration film adhesive layer 130 is bonded. Details thereof will be described below with reference to FIG. 4 through FIG. 6.

One surface of the decoration film adhesive layer 130 may be stretched along a lower surface of the decoration film 120 on its one side, a lateral surface of the decoration film 120 on its one side, the cover window 110, a lateral surface of the decoration film 120 on its other side, and a lower surface of the decoration film 120 on its other side. Further, the other surface of the decoration film adhesive layer 130 is disposed to be bonded along the display panel 140. Therefore, the decoration film adhesive layer 130 may protect a lower surface and an inner surface of the decoration film 120.

Referring to FIG. 1 again, the display panel 140 may be configured to display an image. Although not illustrated in FIG. 1 and FIG. 2, the display panel 140 may include a substrate, an organic light emitting diode disposed on the substrate, and a driving circuit for driving the organic light emitting diode. In this case, the substrate may be formed of a material, such as a polyimide-based material, having flexibility, and thus may be flexible.

The display panel 140 includes a plurality of sub-pixels including red sub-pixels, green sub-pixels, and blue sub-pixels. The red sub-pixels, the green sub-pixels, and the blue sub-pixels emit red, green, and blue lights, respectively, and a full-color image can be provided through the plurality of sub-pixels.

Each sub-pixel may include an organic light emitting diode including a plurality of organic layers. The organic light emitting diode includes an anode, a plurality of organic layers, and a cathode such that an electron and a hole can be combined to emit light. The plurality of organic layers may include a hole injection layer HIL, a hole transport layer HTL, an emitting layer EML, an electron transport layer ETL, and an electron injection layer EIL, but may not be limited thereto.

The driving circuit is a circuit unit for driving the organic light emitting diode. The driving circuit may include various circuit components such as a switching thin film transistor, a driving thin film transistor, a capacitor, etc., and various lines, but is not limited thereto. Although not illustrated in FIG. 1 and FIG. 2, various insulation layers may be formed between the substrate and a display unit. Further, at least some of the insulation layers formed between the substrate and the display unit may also be formed in the non-display area, a bending area, and the like.

The back cover 150 is a substrate supporting the display panel 140, and protects the display panel 140 against the external environment. The back cover 150 has a flat plate shape, and may be formed of metal or plastic having excellent durability so as to protect the display panel 140 against external shocks. However, unlike the illustration, some of four edges of the back cover 150 may be upwardly protruded depending on the design.

An image displayed through the display panel 140 can be seen from the outside as follows.

The image displayed through the display panel 140 may be projected to the outside through the decoration film adhesive layer 130 and the cover window 110. Specifically, a part of the image displayed through the display panel 140 may be projected toward the decoration film 120 and thus may be shielded by the plurality of layers of the decoration film 120. As described above, the decoration film adhesive layer 130 is formed transparent and thus provides a high light transmittance. Therefore, a part of the image displayed through the display panel 140 may be projected toward the display area D/A of the cover window 110 and thus may be projected to the outside through the decoration film adhesive layer 130.

The display device 100 according to an exemplary embodiment of the present disclosure includes the delamination reduction layer 125 having a high adhesive power at a lowermost end of the decoration film 120. Thus, the adhesive power between a cover unit including the cover window 110 and the decoration film 120 and the display panel 140 can be increased. Specifically, as described above, the delamination reduction layer 125 disposed at the lowermost end of the decoration film 120 has a higher surface energy than the lowermost layer 124d among the plurality of layers. Therefore, the delamination reduction layer 125 has a high adhesive power. The delamination reduction layer 125 may be formed of, e.g., transparent ink, but is not limited thereto. Therefore, the display device 100 according to an exemplary embodiment of the present disclosure can provide a high adhesive power between the cover unit and the display panel 140 with the delamination reduction layer 125.

Figure 3A:
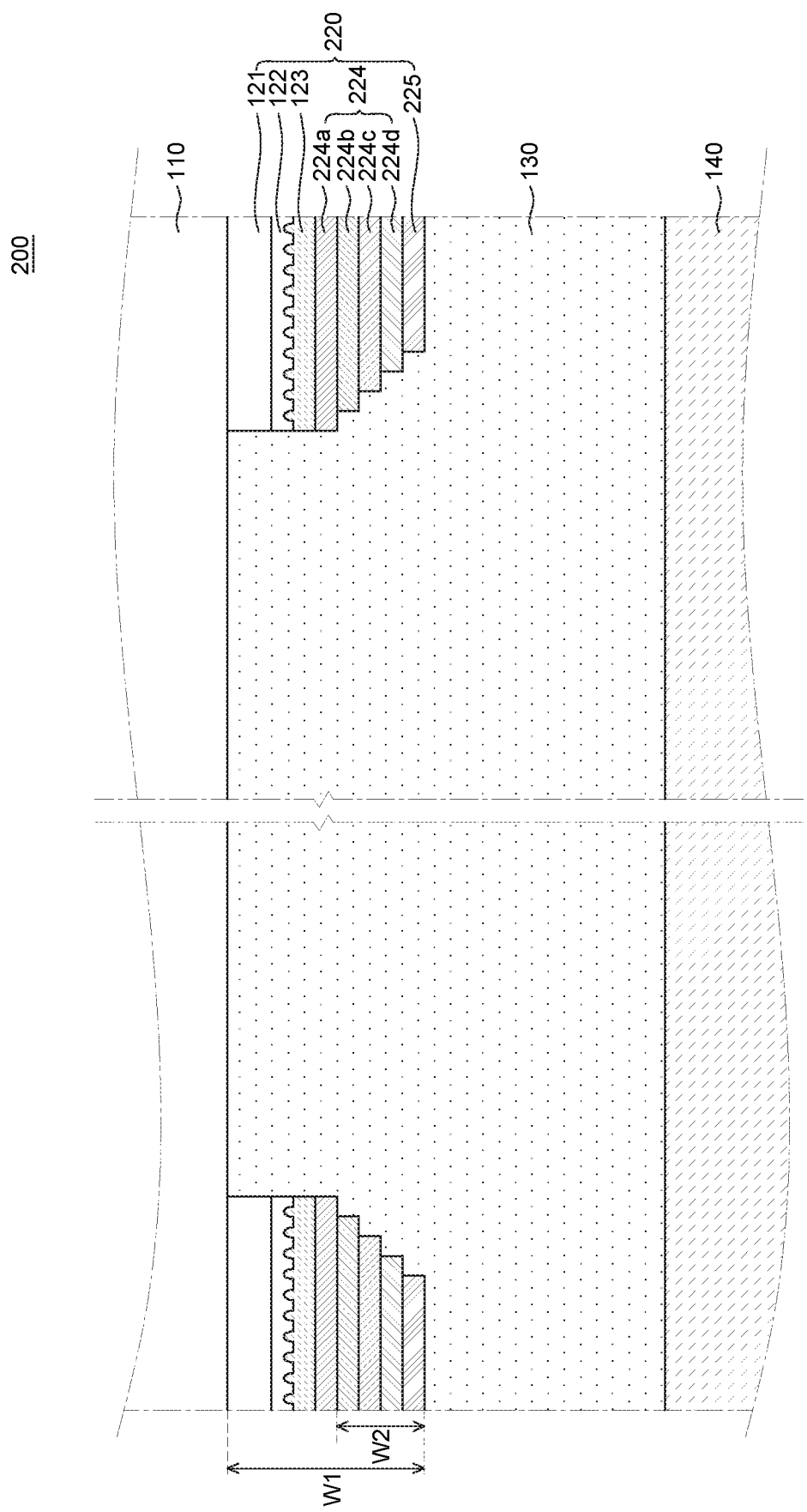
FIG. 3A is a schematic cross-sectional view of a display device according to another exemplary embodiment of the present disclosure.
Figure 3B:
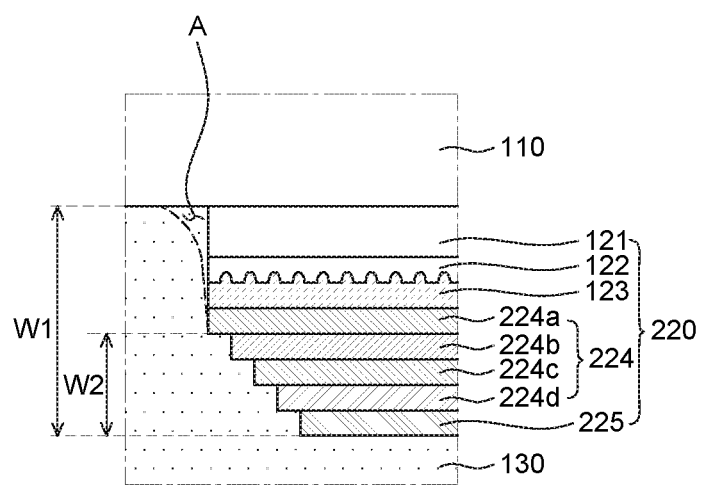
FIG. 3B is a partial cross-sectional view of the display device in which bubbles are generated.

FIG. 3A is a schematic cross-sectional view of a display device according to another exemplary embodiment of the present disclosure. FIG. 3B is a partial cross-sectional view of the display device in which bubbles are generated. A display device 200 illustrated in FIG. 3A is substantially the same as the display device 100 illustrated in FIG. 2 except the widths of a print layer 224 and a delamination reduction layer 225. Therefore, the detailed explanation thereof will be omitted.

Referring to FIG. 3A, the display device 200 includes the display panel 140, a decoration film 220 disposed on the display panel 140, and the cover window 110.

A plurality of layers of the print layer 224 may be formed to be decreased in width as being farther from the cover window 110. Specifically, as illustrated in FIG. 3, a first layer 224a of the print layer 224 is disposed closest to the cover window 110 and a second layer 224b to a fourth layer 224d are disposed in sequence to be farther from the cover window 110.

Herein, the first layer 224a may have the same width as the adhesive layer 121, the pattern layer 122, and the mold layer 123. Further, the second layer 224b may have a smaller width than the first layer 224a, and a third layer 224c may have a smaller width than the second layer 224b. Further, the fourth layer 224d may have a smaller width than the third layer 224c. Furthermore, the delamination reduction layer 225 may have a smaller width than the fourth layer 224d which is a lowermost layer of the print layer 224. Therefore, the plurality of layers of the print layer 224 and the delamination reduction layer 225 may form a predetermined sloped surface.

Further, when the decoration film adhesive layer 130 is bonded to the decoration film 220, the decoration film adhesive layer 130 may be provided as being bonded to the sloped surface formed by the print layer 224 and the delamination reduction layer 225. Specifically, as illustrated in FIG. 3, the decoration film adhesive layer 130 may be slantly bonded to a lateral surface of the decoration film 220 as being in contact with each end of the delamination reduction layer 225, the fourth layer 224d, the third layer 224c, the second layer 224b, and the first layer 224a in sequence from the bottom. As described above, the decoration film adhesive layer 130 is capable of being easily stretched. Therefore, even if the plurality of layers of the print layer 224 is formed into steps, the decoration film adhesive layer 130 may be formed to easily fill the steps of the print layer 224.

Accordingly, in the display device 200 according to another exemplary embodiment of the present disclosure, the generation of bubbles which may occur when the decoration film adhesive layer 130 is bonded to the decoration film 220 and the cover window 110 can be minimized.

Specifically, referring to FIG. 3B, when the decoration film adhesive layer 130 is bonded to the cover window 110, bubbles may be generated by a space A formed between the lateral surface of the decoration film 220 and the decoration film adhesive layer 130.

Figure 4:
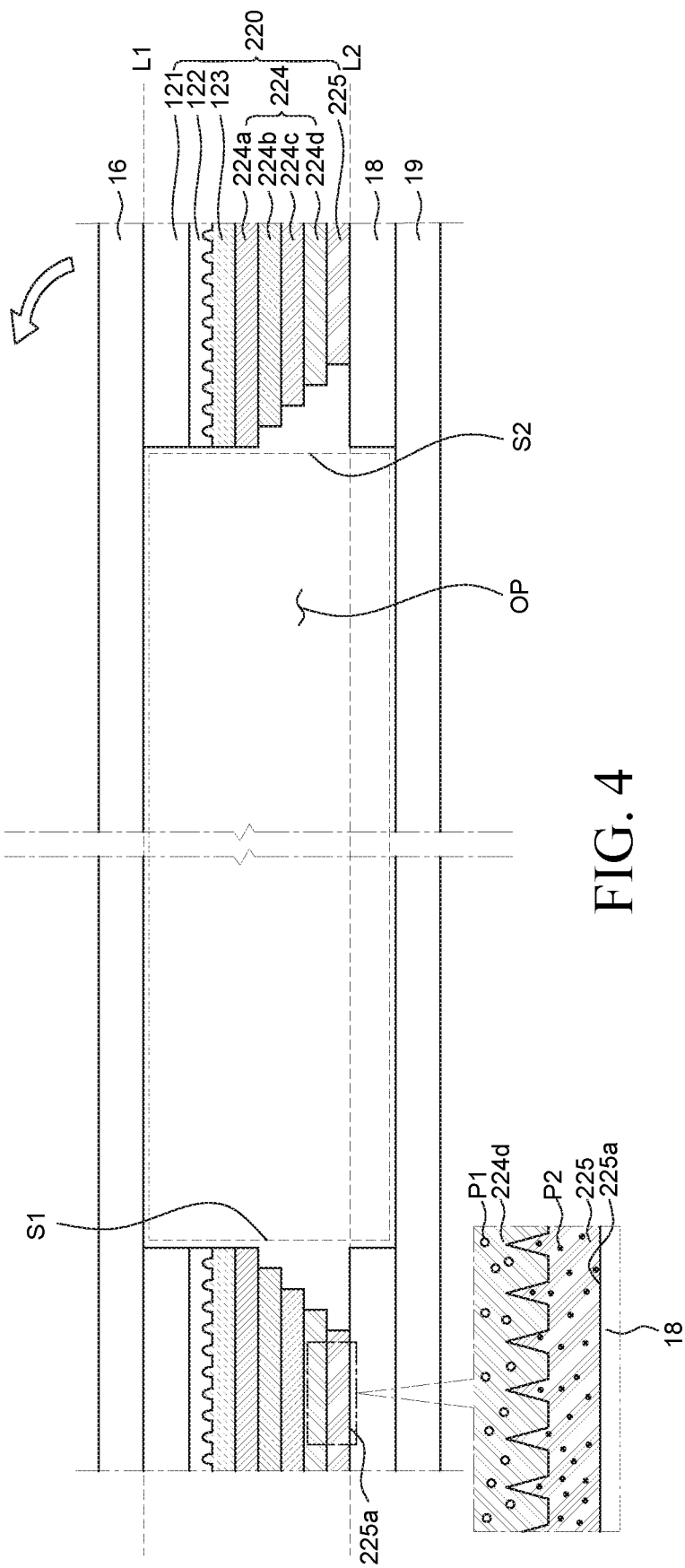
FIG. 4 through FIG. 6 are cross-sectional views illustrating a process of bonding a decoration film illustrated in FIG. 3A to a cover window and a display panel.

As described above, the decoration film adhesive layer 130 has ductility which enables the decoration film adhesive layer 130 to be deformed by an external pressure. Further, during a process of bonding the decoration film adhesive layer 130 to the cover window 110, a part of the decoration film adhesive layer 130 may be deformed due to the ductility of the decoration film adhesive layer 130. Thus, the decoration film adhesive layer 130 needs to be introduced into the display area opening OP of the decoration film 220 disposed on both ends as illustrated in FIG. 4.

In this case, if an inner surface of the decoration film 220 includes a sloped surface, the decoration film adhesive layer 130 can be more easily introduced into the display area opening OP of the decoration film 220. Specifically, in the display device 200 according to an exemplary embodiment of the present disclosure, the length of a vertical portion of the decoration film adhesive layer 130 to be deformed by ductility and then introduced into the display area opening OP (refer to FIG. 4) is decreased from the whole thickness W1 of the decoration film 220 to a thickness W2 excluding the print layer 224 and the delamination reduction layer 225 of the decoration film 220. That is, since the inner surface of the decoration film 220 includes the sloped surface, the length of the vertical portion of the decoration film adhesive layer 130 to be deformed by ductility and then introduced into the display area opening OP (refer to FIG. 4) is decreased. Therefore, when the decoration film adhesive layer 130 is bonded to the cover window 110, the space A between the decoration film adhesive layer 130 and the decoration film 220 can be minimized.

Therefore, in the display device 200 according to an exemplary embodiment of the present disclosure, bubbles which may be generated by the space A between the decoration film adhesive layer 130 and the cover window 110 and the decoration film 220 can be minimized.

Further, in the display device 200 according to another exemplary embodiment of the present disclosure, the decoration film adhesive layer 130 may be formed to closely cover the inner surface of the decoration film 220. Specifically, as the area of a contact surface between the decoration film adhesive layer 130 and the decoration film 220 is increased, the decoration film adhesive layer 130 may be formed to more closely cover the inner surface of the decoration film 220.

Although FIG. 3A and FIG. 3B illustrate that the print layer 224 and the delamination reduction layer 225 have right-angled end portions, the present disclosure is not limited thereto. The print layer 224 and the delamination reduction layer 225 may have gently curved end portions. Accordingly, the print layer 224 and the delamination reduction layer 225 may form a sloped layer which is substantially even.

Figure 5:
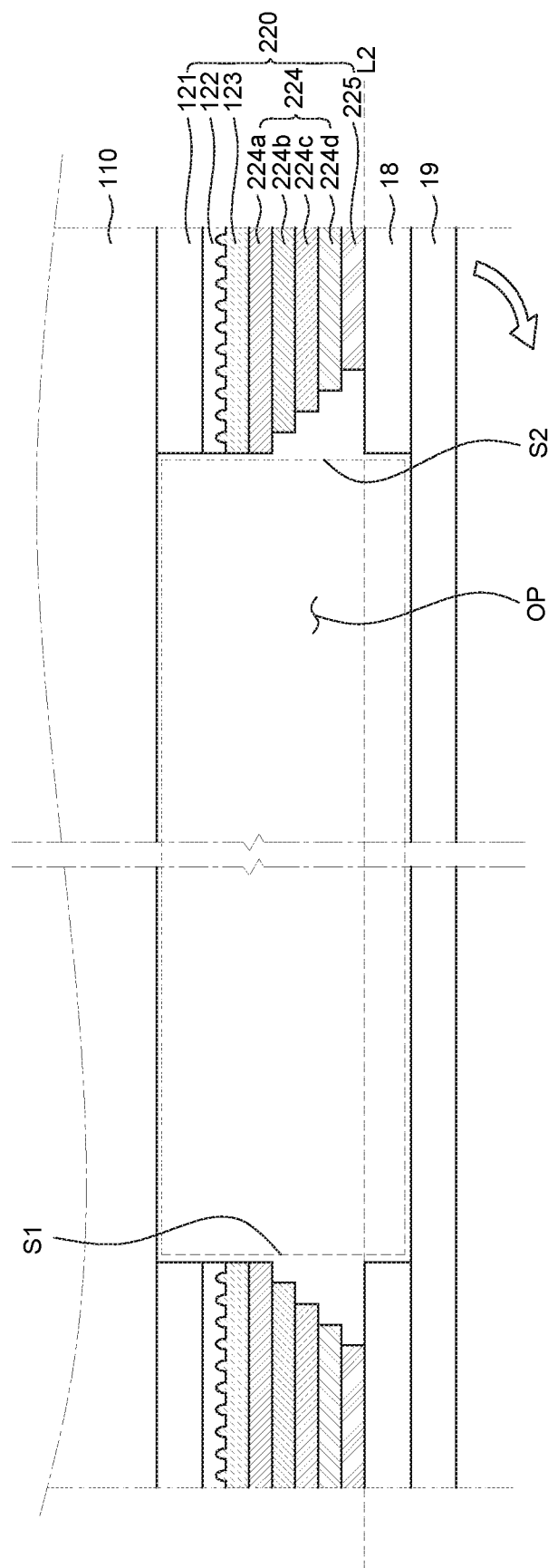
Figure 6:
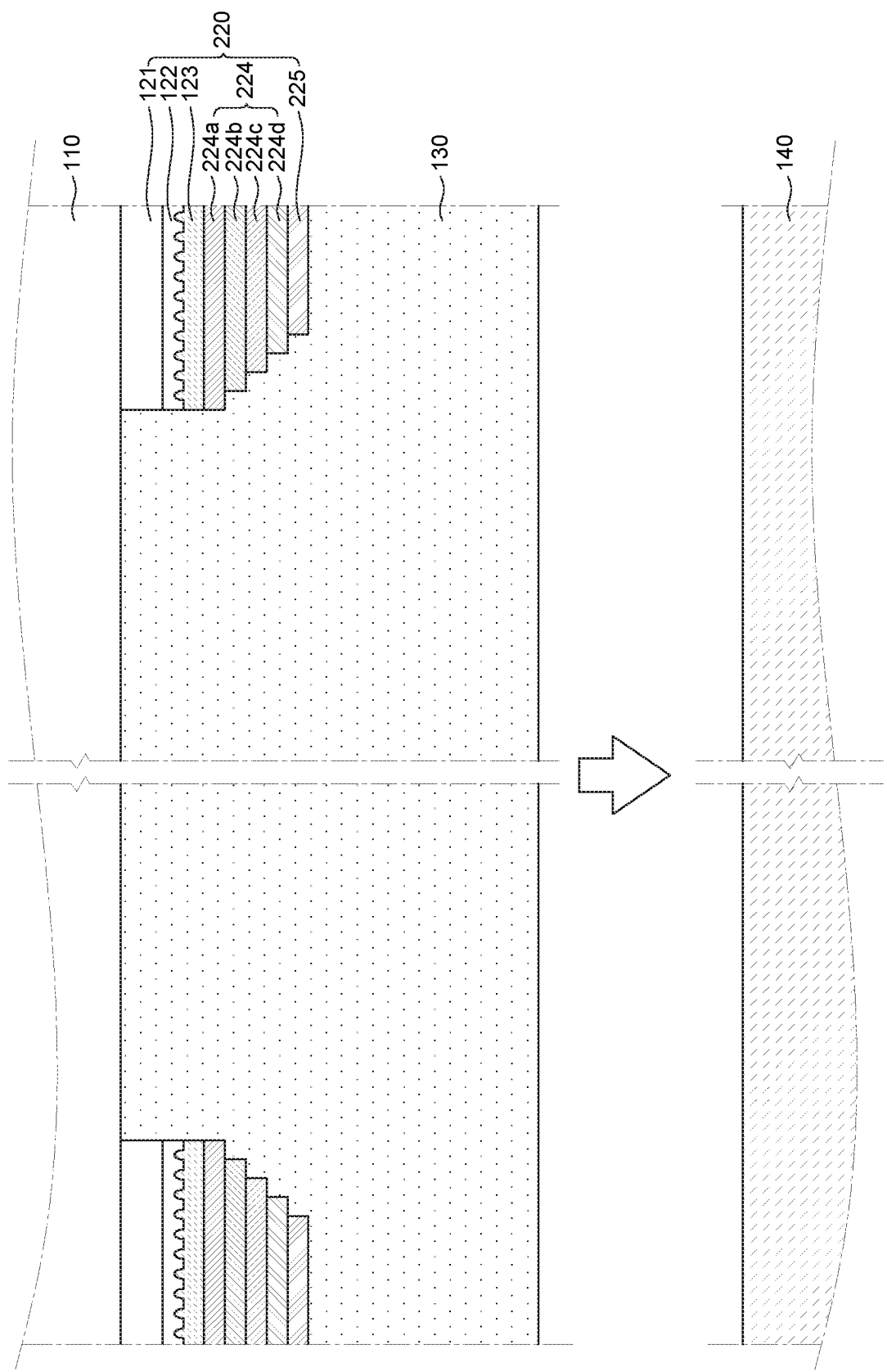

FIG. 4 through FIG. 6 are cross-sectional views illustrating a process of bonding a decoration film illustrated in FIG. 3A to a cover window and a display panel. The decoration film 220 goes through a process of being bonded to each of the cover window 110 and the display panel 140. FIG. 4 through FIG. 6 illustrate a process of reducing reverse delamination which occurs during the bonding process.

FIG. 4 is a diagram illustrating that an upper protective film 16, a first lower protective film 18 and a second lower protective film 19 are disposed on the upper and lower sides of the decoration film 220 illustrated in FIG. 3A. FIG. 5 is a diagram illustrating that the upper protective film 16 is removed from the decoration film 220 illustrated in FIG. 4 and then bonded to the cover window 110. FIG. 6 is a diagram illustrating that the lower protective films are removed from the decoration film 220 illustrated in FIG. 5 and then the decoration film adhesive layer 130 is bonded to the lower side of the decoration film 220 and bonded to the display panel 140.

Referring to FIG. 4, the upper protective film 16 is disposed on the upper side of the decoration film 220 and the first lower protective film 18 and the second lower protective film 19 are disposed on the lower side of the decoration film 220. The upper protective film 16 functions to protect an upper surface of an adhesive layer 221 before the decoration film 220 is bonded to the cover window 110. The first lower protective film 18 and the second lower protective film 19 function to protect a lower surface of the decoration film 220 and the display area opening OP of the decoration film 220 before the decoration film 220 is bonded to the display panel 140.

In order to bond the cover window 110 to an upper part of the decoration film 220, the upper protective film 16 covering the upper part of the decoration film 220 may be removed. In this case, the upper protective film 16 covering the upper part of the decoration film 220 is removed by delamination one side of the upper protective film 16 off the decoration film 220. Accordingly, the upper protective film 16 is removed along a first line L1 which is the boundary between the decoration film 220 and the upper protective film 16.

However, the display area opening OP of the decoration film 220 has a large area as compared with the other area of the decoration film 220, and a polyethylene terephthalate layer (PET layer) having a considerable thickness is removed to provide the thin decoration film 220. Thus, the stiffness of the decoration film 220 may be decreased.

Therefore, during the process of removing the upper protective film 16 bonded to the decoration film 220, the upper protective film 16 may not be removed from the decoration film 220 along the first line L1. Instead, in a state where the upper protective film 16 and the decoration film 220 are bonded to each other, the first lower protective film 18 may be separated from the decoration film 220. In this case, during the process of removing the upper protective film 16, the decoration film 220 may not be spaced from the upper protective film 16 but may be spaced from the first lower protective film 18 along a second line L2.

That is, when one side of the upper protective film 16 is pulled (as indicated by an arrow in FIG. 4), the decoration film 220 may be delaminated from the first lower protective film 18 along the second line L2 which is the boundary between the decoration film 220 and the first lower protective film 18. This phenomenon may be referred to as reverse delamination since the decoration film 220 is delaminated not along the first line L1 along which the decoration film 220 is supposed to be delaminated, but along the second line L2 on the opposite side.

The delamination reduction layer 225 disposed under the print layer 224 can suppress reverse delamination of the decoration film 220. Specifically, as described above, in the delamination reduction layer 225, an opposite surface of one surface in contact with the print layer 224 has a higher surface energy than a lowermost layer among the plurality of layers of the print layer 224. That is, a contact surface between the delamination reduction layer 225 and the first lower protective film 18 has a higher surface energy than a contact surface between the fourth layer 224*d* and the delamination reduction layer 225.

For example, a case where the delamination reduction layer 225 is not provided unlike an exemplary embodiment of the present disclosure will be described below.

If the delamination reduction layer 225 is not provided, the fourth layer 224*d* is bonded to the first lower protective film 18. However, the fourth layer 224*d* is a part of the print layer 224 and is made up of particles for printing. Specifically, in order for a pattern such as a character to be seen from the outside, the fourth layer 224*d* may be made up of particles larger in size than those of the delamination reduction layer 225. Further, since the fourth layer 224*d* are made up of large particles, the surface roughness of the fourth layer 224*d* may be increased.

That is, the fourth layer 224*d* has a high surface roughness and also has a considerably lower surface energy than the delamination reduction layer 225. Thus, when the upper protective film 16 is removed from the decoration film 220, the adhesive power between the first lower protective film 18 and the fourth layer 224*d* may be lower than the adhesive power between the upper protective film 16 and the adhesive layer 221. Thus, during the delamination process of the upper protective film 16, reverse delamination may occur.

A material having a higher surface energy has a higher adhesive power. Therefore, in the display device 200 of the present disclosure provided with the delamination reduction layer 225 as compared with the case where the delamination reduction layer 225 is not provided, reverse delamination can be minimized. Therefore, in the display device 200 according to an exemplary embodiment of the present disclosure, since the delamination reduction layer 225 has a high surface energy, the adhesive power between the delamination reduction layer 225 and the first lower protective film 18 may be higher than the adhesive power between the adhesive layer 221 and the upper protective film 16.

Further, the decoration film 220 according to another exemplary embodiment of the present disclosure has a relatively small thickness since the PET layer is removed. Furthermore, since there is no resilience of the PET layer to return to its original state, the decoration film 220 can be easily bonded to the curved cover window 110.

For example, in order for the delamination reduction layer 225 to have a high surface energy, the delamination reduction layer 225 may be formed of a material having a higher surface tension and containing larger particles than the fourth layer 224*d*. If a material has a high surface tension, its surface energy may be high. If the material contains smaller particles, its adhesive performance may be further increased.

Specifically, as illustrated in FIG. 4, a particle P1 in the fourth layer 224*d* may be smaller than a particle P2 in the delamination reduction layer 225. Thus, in the delamination reduction layer 225, a surface 225*a* in contact with the first lower protective film 18 may have a lower surface roughness than each interface of the fourth layer 224*d*. Therefore, since the contact surface between the delamination reduction layer 225 and the first lower protective film 18 has a low surface roughness, the delamination reduction layer 225 and the first lower protective film 18 can be more strongly bonded to each other. Further, the delamination reduction layer 225 may fill cracks in the fourth layer 224*d*, so that the adhesive power between the delamination reduction layer 225 and the fourth layer 224*d* may be increased.

Also, the delamination reduction layer 225 may contain epoxy having polarity. Specifically, the delamination reduction layer 225 may be formed of a resin including epoxy having polarity. Since the delamination reduction layer 225 contains the epoxy having polarity, the delamination reduction layer 225 may have an excellent adhesive power with respect to a material having polarity.

Otherwise, the delamination reduction layer 225 may be formed including transparent ink. In this case, the transparent ink may fill a prints surface of the fourth layer 224*d*, so that the delamination reduction layer 225 can be easily bonded to the fourth layer 224*d*.

That is, since the display device 200 according to an exemplary embodiment of the present disclosure includes the delamination reduction layer 225 having a high surface energy, reverse delamination of the decoration film 220 which may occur when the upper protective film 16 can be minimized.

Meanwhile, the print layer 224 may include a sloped surface at the boundary between the display area D/A and the bezel area B/A of the cover window 110. That is, as described above, the plurality layers of the print layer 224 may be formed to be decreased in width as being farther from the cover window 110. In other words, the plurality of layers of the print layer 224 may be formed into steps decreased in width as being farther from the cover window 110.

In the plurality of layers of the print layer 224, a layer close to the cover window 110 to a layer close to the delamination reduction layer 225 may be formed to be gradually recessed from interfaces S1 and S2 of the display area opening. That is, in the plurality of layers of the print layer 224, a layer close to the cover window 110 to a layer close to the delamination reduction layer 225 may be gradually decreased in size from the interfaces S1 and S2 of the display area opening.

Specifically, the both interfaces S1 and S2 of the display area opening OP formed between the display area opening OP and the adhesive layer 221, the pattern layer 222, and the mold layer 123 as illustrated in FIG. 4 are the boundaries between the display area D/A and the bezel area B/A of the cover window 110. Further, the both interfaces S1 and S2 of the display area opening OP formed between the display area opening OP and the adhesive layer 221, the pattern layer 222, and the mold layer 123 may be referred to as inner surfaces of the decoration film 220. Meanwhile, the display area opening 220 of the decoration film 220 may be formed by laser cutting.

Herein, as illustrated in FIG. 4, the first layer 224a may be formed to have the same width as the mold layer 123. Further, the second layer 224b disposed under the first layer 224a may be formed to have a smaller width than the first layer 224a. The third layer 224c disposed under the second layer 224b may be formed to have a smaller width than the second layer 224b. The fourth layer 224d disposed under the third layer 224c may be formed to have a smaller width than the third layer 224c. That is, in the plurality of layers, a layer close to the cover window 110 to a layer close to the delamination reduction layer 225 may be gradually decreased in size from the boundary of the decoration film 220.

Further, the delamination reduction layer 225 disposed under the print layer 224 may be formed to a smaller width than the fourth layer 224d which is the lowermost layer of the print layer 224. Also, the delamination reduction layer 225 may be formed to be further decreased in size than the fourth layer 224d from the boundary of the decoration film 220. Therefore, the inner surface of the decoration film 220 may form a sloped surface.

That is, the sloped surface of the decoration film 220 may be formed along the plurality of layers of the print layer 224, and a layer close to the cover window among the plurality of layers may have a greater width than a layer close to the delamination reduction layer 225.

As illustrated in FIG. 6, since the inner surface of the decoration film 220 forms a sloped surface, the decoration film adhesive layer 130 is bonded to the decoration film 220 along the sloped surface of the decoration film 220. Thus, as described above, the vertical length of the decoration film adhesive layer 130 bonded to the cover window 110 as being spaced from the decoration film 220 in the drawing becomes relatively short. Therefore, a space among the decoration film adhesive layer 130, the cover window 110, and the decoration film 220 can be minimized. Accordingly, the generation of bubbles between the cover window 110 and the decoration film adhesive layer 130 is reduced. Further, the decoration film adhesive layer 130 may closely cover the decoration film 220.

Meanwhile, unlike the illustration in FIG. 4, the sloped surface of the decoration film 220 may be formed in other areas than the print layer 224. Specifically, at least one of the adhesive layer 221, the print layer 224, and the delamination reduction layer 225 may include a sloped surface at the interfaces S1 and S2 between the decoration film 220 and the display area opening which are the boundaries between the display area D/A and the bezel area B/A of the cover window 110, or may be formed to be decreased in width as being farther from the cover window 110. Therefore, the inner surface of the decoration film 220 may include a sloped surface.

Meanwhile, in order for the plurality of layers of the print layer 224 to be easily formed into steps as described above, the print layer 224 may be formed by a silk-screen printing process. Specifically, the first layer 224a to the fourth layer 224d may be formed in sequence by the silk-screen printing process. In this case, when the first layer 224a to the fourth layer 224d are formed, the print layer 224 including the plurality of layers may be formed into steps as described above.

Meanwhile, after all the layers of the print layer 224 up to the fourth layer 224d are formed, the delamination reduction layer 225 may also be formed by the same silk-screen printing process as performed to the plurality of layers of the print layer 224. Specifically, after the fourth layer 224d is formed, the delamination reduction layer 225 may be formed by the silk-screen printing process.

That is, in the display device 200 according to an exemplary embodiment of the present disclosure, the delamination reduction layer 225 may be formed by the same silk-screen printing process used for forming the first layer 224a to the fourth layer 224d of the print layer 224. Therefore, in the display device 200 according to an exemplary embodiment of the present disclosure, an additional manufacturing process for forming the delamination reduction layer 225 is not required. Accordingly, economic efficiency during a manufacturing process can be achieved.

Hereinafter, a process of bonding the cover window 110 and the display panel 140 to the decoration film 220 will be described in detail with reference to FIG. 4 through FIG. 6.

Referring to FIG. 4, the upper protective film 16 bonded to an upper part of the decoration film 220 is removed from the decoration film 220. In this case, the upper protective film 16 may be removed along the first line L1. Since the upper protective film 16 is removed, the upper part of the decoration film 220 may be exposed to the outside.

Referring to FIG. 5, the cover window 110 may be bonded to the upper part of the decoration film 220 exposed to the outside. Then, the first lower protective film 18 and the second lower protective film 19 bonded to a lower part of the decoration film 220 may be removed along the second line L2 which is the boundary between the first lower protective film 18 and the delamination reduction layer 225. In this case, the first lower protective film 18 and the second lower protective film 19 can be strongly bonded to each other, and, thus, the first lower protective film 18 and the second lower protective film 19 can be removed at the same time. Since the first lower protective film 18 and the second lower protective film 19 are removed from the decoration film 220, the lower part of the decoration film 220 may be exposed to the outside.

Referring to FIG. 6, the decoration film adhesive layer 130 may be bonded to the lower part of the decoration film 220. Specifically, the decoration film adhesive layer 130 may be bonded to the lower part of the decoration film 220 while surrounding the lateral surface of the decoration film 220 and the display area D/A of the cover window 110. After the decoration film adhesive layer 130 is bonded to the decoration film 220, the decoration film 220 and the decoration film adhesive layer 130 may be bonded to the display panel 140.

Figure 7:
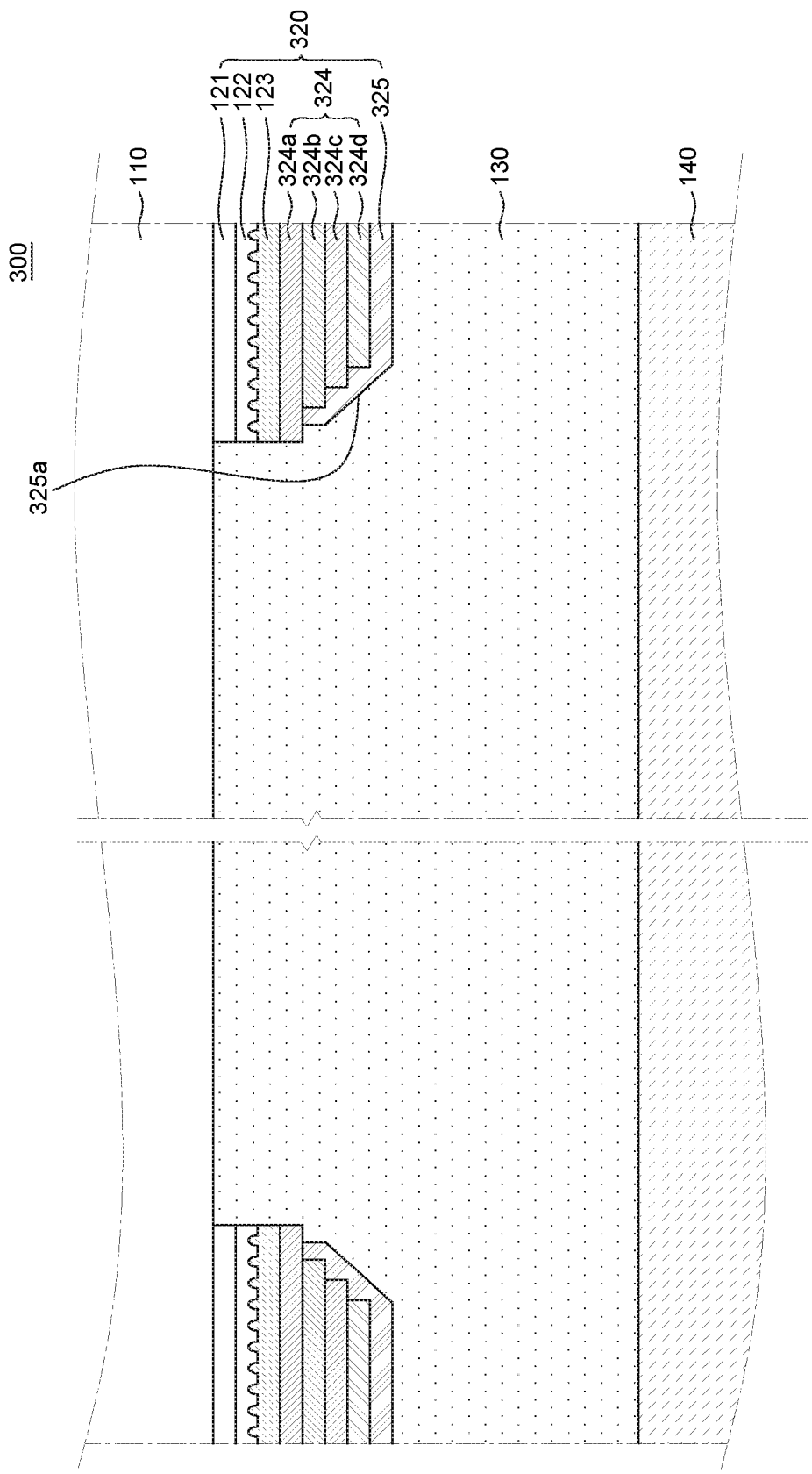
FIG. 7 is a cross-sectional view illustrating a decoration film according to yet another exemplary embodiment of the present disclosure.

FIG. 7 is a cross-sectional view illustrating a display device according to yet another exemplary embodiment of the present disclosure. A display device 300 illustrated in FIG. 7 is substantially the same as the display device 200 illustrated in FIG. 3 except the shapes of a print layer 324 and a delamination reduction layer 325. Therefore, the detailed explanation thereof will be omitted.

Referring to FIG. 7, the display device 300 according to an exemplary embodiment of the present disclosure includes the cover window 110, a decoration film 320, and the display panel 140.

Each of layers 324a, 324b, 324c, and 324d of the print layer 324 may be formed by the silk-screen printing process as described above. Therefore, each of the layers 324a, 324b, 324c, and 324d of the print layer 324 may be adjusted in length. That is, the layers 324a, 324b, 324c, and 324d of the print layer 324 may be formed into steps, but a difference in width between the layers 324a, 324b, 324c, and 324d may be different from each other. Herein, the lengths of the layers 324a, 324b, 324c, and 324d of the print layer 324 illustrated in FIG. 7 may be different from the lengths of the corresponding layers 224a, 224b, 224c, and 224d of the print layer 224 illustrated in FIG. 3, respectively. For example, the lengths of the layers 324a, 324b, 324c, and 324d of the print layer 324 may be greater than the lengths of the corresponding layers 224a, 224b, 224c, and 224d of the print layer 224, respectively, in order for the delamination reduction layer 325 to be easily formed to cover the plurality of layers.

The delamination reduction layer 325 may be formed to cover at least two layers of the plurality of layers of the print layer 324. Specifically, as illustrated in FIG. 7, the delamination reduction layer 325 is formed to cover a part of the first layer 324a and inwardly exposed parts of the second layer 324b, the third layer 324c and the fourth layer 324d. Thus, the delamination reduction layer 325 may include a sloped surface 325a.

Since the delamination reduction layer 325 includes the sloped surface 325a, the delamination reduction layer 325 in the display device 300 according to an exemplary embodiment of the present disclosure is disposed to cover the plurality of layers of the print layer 324. Thus, the delamination reduction layer 325 can protect the print layer 324 against external shocks or foreign materials.

Further, since the delamination reduction layer 325 includes the sloped surface 325a, the decoration film adhesive layer 130 may be bonded to the decoration film 320 along the sloped surface 325a of the delamination reduction layer 325. That is, in the display device 300 according to an exemplary embodiment of the present disclosure, the delamination reduction layer 325 includes the sloped surface 325a, so that the decoration film adhesive layer 130 may be brought into surface contact with the sloped surface 325a of the delamination reduction layer 325. Therefore, the decoration film adhesive layer 130 can be more securely bonded to the delamination reduction layer 325. Further, since the delamination reduction layer 325 has a high surface energy and is in surface contact with the decoration film adhesive layer 130, the decoration film adhesive layer 130 and the decoration film 320 can be more securely bonded to each other.

Figure 8:
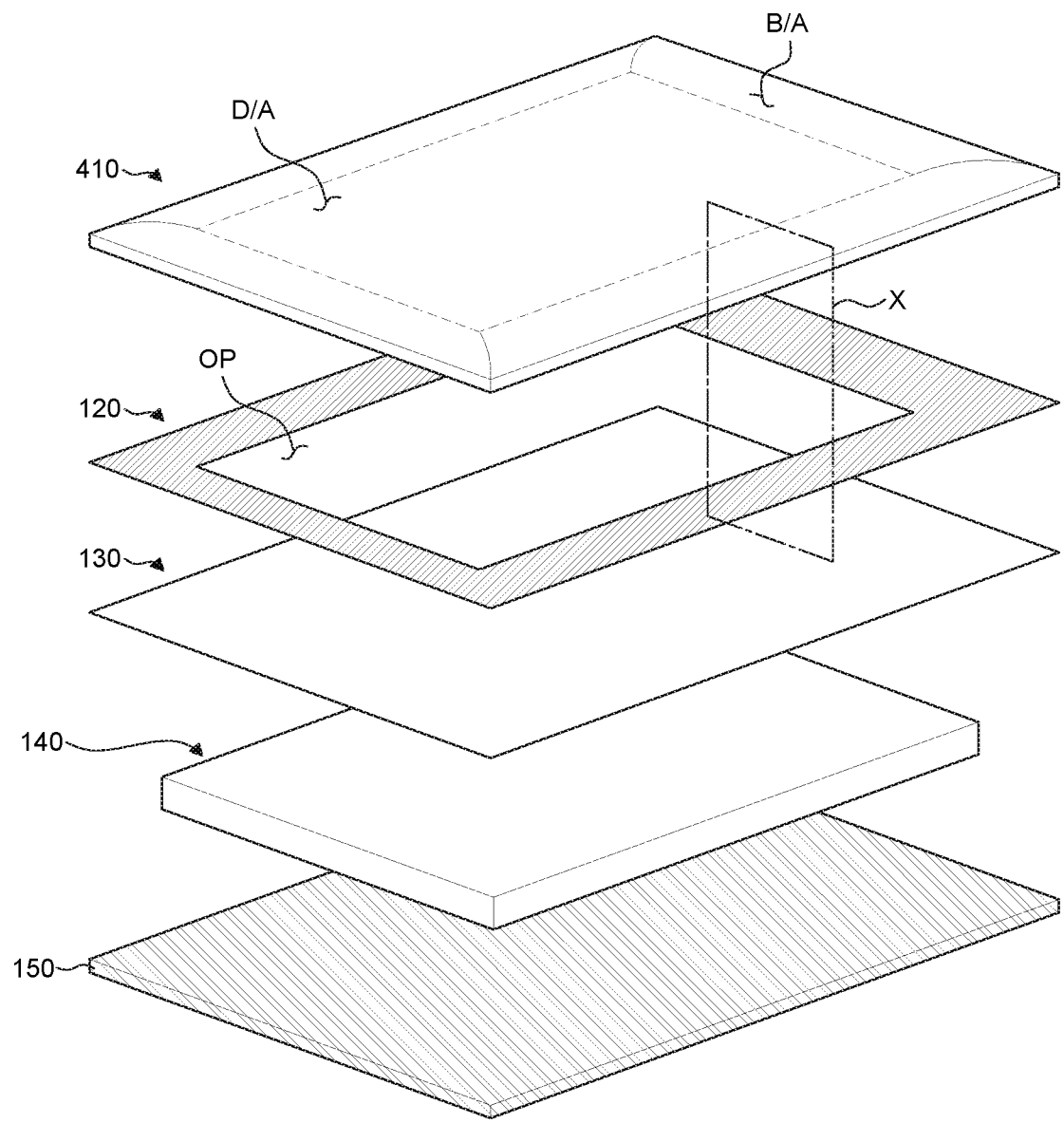
FIG. 8 is a schematic exploded perspective view of a display device according to still yet another exemplary embodiment of the present disclosure.
Figure 9:
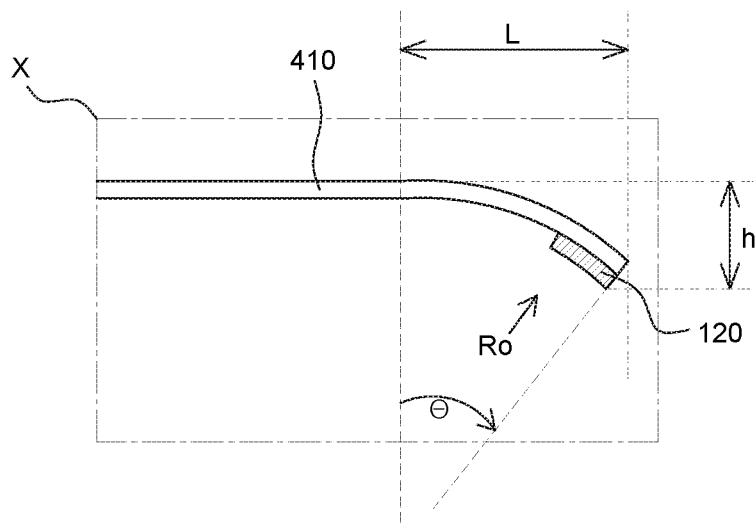
FIG. 9 is a partial cross-sectional view illustrating that a cover window and a decoration film are bonded to each other in a portion X of FIG. 8.

FIG. 8 is a cross-sectional view illustrating a display device according to still yet another exemplary embodiment of the present disclosure. FIG. 9 is a partial cross-sectional view illustrating that a cover window and a decoration film are bonded to each other in a portion X of FIG. 8. A display device 400 illustrated in FIG. 8 is substantially the same as the display device 100 illustrated in FIG. 1 except the shape of a cover window 410. Therefore, the detailed explanation thereof will be omitted.

Referring to FIG. 8, the display device 400 includes the cover window 410, the decoration film 120, the decoration film adhesive layer 130, the display panel 140, and the back cover 150. The cover window 410 covers the display panel 140 and protects the components of the display panel 140 against external shocks, foreign materials, or moisture.

As illustrated in FIG. 8, all four edges of the cover window 410 may be formed to be curved toward the back cover 150. That is, all four edges of the cover window 410 may be formed to be bendable. In the curved cover window 410, end portions of the cover window 410 which can be touched by hands of a user of the display device 400 are curved, which may increase the convenience in use.

In this case, each curved edge of the cover window 410 may have the same curvature as its corresponding edge. Specifically, the curvature of the edges in an up-and-down direction may be the same as and the curvature of the edges in a left-and-right direction, but may not be limited thereto.

The curved edges of the cover window 410 may have various curvatures. For example, referring to FIG. 9, a horizontal length L of the curved edge may be in the range of 3.32 mm to 6.96 mm depending on the design. A height h of the curved edge may be in the range of 1.15 mm to 3.35 mm depending on the design. A radius $R_0$ of the curvature may be in the range of 5.55 mm to 5.86 mm depending on the design. An angle $\Theta$ of a curved arc may be in the range of 30 degrees to 57 degrees depending on the design. The shape of the edge of the cover window 410 is not limited thereto.

Further, unlike the illustration in FIG. 8, some of the four edges of the cover window 410 may be curved. Also, at least two curved edges of the four edges of the cover window 410 may have different curvatures from each other.

As illustrated in FIG. 9, the decoration film 120 may be bonded to a back surface of the curved edges of the cover window 410. As described above, the decoration film 120 is formed without including the PET layer and thus may be formed to a smaller thickness. Therefore, the decoration film 120 has a reduced resilience as compared with a case where the PET layer is present.

Therefore, the decoration film 120 can be easily bonded to the curved edges of the cover window 410, and the separation of the decoration film 120 from the cover window 410 caused by the resilience of the decoration film 120 can be reduced.

That is, the decoration film 120 in the display device 400 according to still yet another exemplary embodiment of the present disclosure is relatively decreased in resilience which may be generated when the PET layer is present. Thus, the decoration film 120 can be easily bonded to the cover window 410 including the curved edges.

The exemplary embodiments of the present disclosure can also be described as follows:

According to an aspect of the present disclosure, a display device includes a cover window including a display area and a non-display area surrounding the display area, an adhesive layer in direct contact with a lower part of the cover window, a print layer disposed under the adhesive layer and including a plurality of layers, and a delamination reduction layer disposed under the print layer. In the delamination reduction layer, an opposite surface of one surface in contact with the print layer has a higher surface energy than a lowermost layer among the plurality of layers of the print layer.

At least one of the adhesive layer, the print layer, and the delamination reduction layer may include a sloped surface at a boundary between the display area and the non-display area, or may be formed to be decreased in width as being farther from the cover window.

The sloped surface may be formed along the plurality of layers of the print layer, and in the plurality of layers, a layer close to the cover glass may have a greater width than a layer close to the delamination reduction layer.

In the plurality of layers, a layer close to the cover glass to a layer close to the delamination reduction layer may be gradually decreased in size from the boundary.

The delamination reduction layer may be made up of smaller particles than the lowermost layer.

The delamination reduction layer may contain epoxy having polarity.

The delamination reduction layer may be formed to cover at least two layers of the plurality of layers.

The display device may further include a pattern layer disposed under the adhesive layer and forming a pattern, and a mold layer disposed between the pattern layer and the print layer and deposited to cover a lower surface of the pattern layer.

The display device may further include a decoration film adhesive layer disposed along the cover window in the display area, the adhesive layer, the print layer, and the delamination reduction layer.

The adhesive layer, the print layer, and the delamination reduction layer may be disposed in the non-display area.

According to another aspect of the present disclosure, a display device includes a cover window including a display area, a decoration film disposed on a back surface of the cover window and including an opening corresponding to the display area, and a display panel disposed under the decoration film. The decoration film includes an adhesive layer bonded to the back surface of the cover window, a print layer disposed under a mold layer and including a plurality of layers, and a delamination reduction layer disposed under the print layer. In the delamination reduction layer, an opposite surface of one surface in contact with the print layer has a higher surface energy than a lowermost layer among the plurality of layers.

The display device may include a decoration film adhesive layer disposed between the decoration film and the display panel.

The plurality of layers that defines a lateral surface of the display area opening includes a lower layer and an upper layer, and a cross section of the opening may be gradually decreased in size from the lower layer toward the upper layer.

The decoration film adhesive layer may be bonded to the decoration film along a sloped direction of the plurality of layers.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
 a cover window including:
  a display area; and
  a non-display area surrounding the display area;
 an adhesive layer in direct contact with a lower surface of the cover window in the non-display area, and not disposed in the display area;
 a print layer disposed under the adhesive layer, the print layer including a plurality of layers;
 a delamination reduction layer disposed under the print layer; and
 a decoration film adhesive layer disposed along the cover window and directly contacting all of: the display area, the adhesive layer, the print layer, and the delamination reduction layer,
 wherein, in the delamination reduction layer, an opposite surface of one surface in contact with the print layer has a higher surface energy than a lowermost layer among the plurality of layers of the print layer, and
 wherein the adhesive layer is between the cover window and the print layer.

2. The display device according to claim 1, wherein at least one of the adhesive layer, the print layer, and the delamination reduction layer includes a sloped surface at a boundary between the display area and the non-display area, or is formed to be decreased in width as being farther from the cover window.

3. The display device according to claim 2, wherein:
 the sloped surface is formed along the plurality of layers of the print layer; and
 in the plurality of layers, a layer closer to the cover window has a greater width than a layer closer to the delamination reduction layer.

4. The display device according to claim 2, wherein, in the plurality of layers, each of a layer closest to the cover window to a layer closest to the delamination reduction is gradually decreased in size from the boundary.

5. The display device according to claim 1, wherein the delamination reduction layer comprises first particles that are smaller than second particles in the lowermost layer.

6. The display device according to claim 1, wherein the delamination reduction layer contains an epoxy having a polarity.

7. The display device according to claim 1, wherein the delamination reduction layer is formed to cover at least two layers of the plurality of layers.

8. The display device according to claim 1, further comprising:
 a pattern layer disposed under the adhesive layer and forming a pattern; and
 a mold layer disposed between the pattern layer and the print layer and deposited to cover a lower surface of the pattern layer.

9. The display device according to claim 1, wherein the print layer and the delamination reduction layer are disposed in the non-display area.

* * * * *